US010497438B2

(12) United States Patent
Choi et al.

(10) Patent No.: US 10,497,438 B2
(45) Date of Patent: Dec. 3, 2019

(54) CROSS-POINT MEMORY ARRAY ADDRESSING

(71) Applicant: SanDisk Technologies LLC, Plano, TX (US)

(72) Inventors: Won Ho Choi, San Jose, CA (US); Ward Parkinson, Boise, ID (US); Zvonimir Bandic, San Jose, CA (US); James O'Toole, Boise, ID (US); Martin Lueker-Boden, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/636,499

(22) Filed: Jun. 28, 2017

(65) Prior Publication Data

US 2018/0301188 A1    Oct. 18, 2018

Related U.S. Application Data

(60) Provisional application No. 62/485,735, filed on Apr. 14, 2017.

(51) Int. Cl.
*G11C 13/00* (2006.01)
*G11C 8/12* (2006.01)
(Continued)

(52) U.S. Cl.
CPC .......... *G11C 13/0026* (2013.01); *G11C 5/066* (2013.01); *G11C 8/10* (2013.01);
(Continued)

(58) Field of Classification Search
CPC ............ G11C 13/0026; G11C 13/0028; G11C 13/004; G11C 13/0069; G11C 2013/0054;
(Continued)

(56) References Cited

U.S. PATENT DOCUMENTS

| 5,361,339 A | 11/1994 | Kadakia et al. |
| 5,640,527 A | 6/1997 | Pecone et al. |

(Continued)

FOREIGN PATENT DOCUMENTS

WO    1996020480    7/1996

OTHER PUBLICATIONS

Tae-Sung Jung et al., A 3.3-V single power supply 16-Mb nonvolatile virtual DRAM using a NAND flash memory technology, http://ieeexplore.ieee.org/document/641697/, Aug. 6, 2002.

(Continued)

*Primary Examiner* — Sung Il Cho
(74) *Attorney, Agent, or Firm* — Vierra Magen Marcus LLP

(57) ABSTRACT

Apparatuses, systems, methods, and computer program products are disclosed for memory array addressing. An addressing circuit is configured to receive an address for an operation on an array of multiple memory regions. An address includes a row address and a column address both multiplexed into the address and received with an activate command for an operation. A row buffer for an array of multiple memory regions is configured to store data identified by multiplexed row and column addresses from the multiple memory regions. Data of an operation is selected from a row buffer based on a second address received with a subsequent command for the operation.

18 Claims, 6 Drawing Sheets

(51) Int. Cl.
*G11C 11/22* (2006.01)
*G11C 5/06* (2006.01)
*G11C 8/10* (2006.01)
*G11C 8/18* (2006.01)

(52) U.S. Cl.
CPC ............ *G11C 8/12* (2013.01); *G11C 11/2255* (2013.01); *G11C 11/2273* (2013.01); *G11C 11/2275* (2013.01); *G11C 13/004* (2013.01); *G11C 13/0028* (2013.01); *G11C 13/0069* (2013.01); *G11C 8/18* (2013.01); *G11C 13/0004* (2013.01); *G11C 13/0007* (2013.01); *G11C 2013/0054* (2013.01); *G11C 2207/2272* (2013.01)

(58) Field of Classification Search
CPC .. G11C 5/066; G11C 8/10; G11C 8/12; G11C 8/18; G11C 11/2255; G11C 11/2273; G11C 11/2275; G11C 2207/2272
USPC .......................................................... 365/148
See application file for complete search history.

(56) References Cited

U.S. PATENT DOCUMENTS

| | | | |
|---|---|---|---|
| 6,385,075 B1 | 5/2002 | Taussig et al. | |
| 7,167,946 B2* | 1/2007 | Osborne | G11C 11/4076 711/105 |
| 7,227,767 B2 | 6/2007 | Rinerson et al. | |
| 7,471,556 B2* | 12/2008 | Chow | G11C 8/08 365/163 |
| 7,643,334 B1* | 1/2010 | Lee | G11C 7/22 365/163 |
| 7,983,104 B2 | 7/2011 | Parkinson et al. | |
| 8,559,232 B2 | 10/2013 | Lee et al. | |
| 8,867,300 B2* | 10/2014 | Ueda | G11C 13/0004 365/148 |
| 9,208,883 B2 | 12/2015 | Alsmeier | |
| 9,286,959 B2 | 3/2016 | Ferreira et al. | |
| 9,312,005 B2 | 4/2016 | Castro | |
| 9,418,738 B2 | 8/2016 | Castro | |
| 9,432,298 B1* | 8/2016 | Smith | H04L 49/9057 |
| 9,442,663 B2 | 9/2016 | Yan et al. | |
| 2005/0117429 A1 | 6/2005 | Lin | |
| 2007/0255891 A1* | 11/2007 | Chow | G06F 12/0804 711/103 |
| 2008/0266991 A1* | 10/2008 | Lee | G06F 11/1044 365/203 |
| 2008/0285334 A1* | 11/2008 | Chow | G11C 8/08 365/163 |
| 2010/0085804 A1* | 4/2010 | Katagiri | G11C 7/08 365/163 |
| 2013/0088911 A1* | 4/2013 | Nakura | G11C 13/0002 365/148 |
| 2014/0122814 A1* | 5/2014 | Mirichigni | G06F 9/30047 711/155 |
| 2016/0012891 A1* | 1/2016 | Intrater | G11C 13/0069 365/148 |
| 2018/0012655 A1* | 1/2018 | Senoo | G11C 11/005 |

OTHER PUBLICATIONS

IBM Applications Note, Understanding DRAM Operation, Dec. 1996.
IEEE International Solid-State Circuits Conference 2017, Session 23, DRAM, MRAM, & DRAM Interfaces.
IEEE International Solid-State Circuits Conference 2017, Session 23, DRAM, MRAM, & DRAM Interfaces, Visuals.
IEEE International Solid-State Circuits Conference 2013, Session 12, Non-Volatile Memory Solutions, 12.1.
Micron, NAND Flash Memory, 2, 4, 8Gb: x8/x16 Multiplexed NAND Flash Memory, 2004.
Tz-Yi Liu et al., A 130.7-mm 2-Layer 32-Gb ReRAM Memory Device in 24-nm Technology, IEEE Journal of Solid-State Circuits, vol. 49, No. 1, Jan. 2014.

* cited by examiner

CROSS-POINT MEMORY ARRAY ADDRESSING

CROSS-REFERENCES TO RELATED APPLICATIONS

This application claims the benefit of U.S. Provisional Patent Application No. 62/485,735 entitled "CROSS-POINT MEMORY ARRAY ADDRESSING" and filed on Apr. 14, 2017 for Won Ho Choi, et al., which is incorporated herein by reference.

TECHNICAL FIELD

The present disclosure, in various embodiments, relates to non-volatile and/or volatile memory and more particularly relates to cross-point memory array addressing.

BACKGROUND

Performing separate sense operations for each read can introduce latency into the read operations. However, a memory device may not have a large enough buffer to store more data than is requested for a read operation, and/or may not receive enough addressing information to retrieve more data than is requested for a read operation.

SUMMARY

Apparatuses are presented for memory array addressing. In one embodiment, an apparatus includes an array of multiple memory regions. An addressing circuit, in certain embodiments, is configured to receive an address for an operation on an array of multiple memory regions. An address, in some embodiments, comprises a row address and a column address both multiplexed into the address and received with an activate command for an operation. In a further embodiment, a row buffer for an array of multiple memory regions is configured to store data identified by multiplexed row and column addresses from multiple memory regions. Data of an operation, in certain embodiments, is selected from a row buffer based on a second address received with a subsequent command for an operation.

One or more additional apparatuses are presented for memory array addressing. In one embodiment, an apparatus includes means for decoding an address received for an operation on an array of non-volatile memory tiles of an integrated circuit die into an array portion, a row address, and/or a column address. An address, in certain embodiments, is received with an activate command for an operation. In a further embodiment, an apparatus includes means for loading data identified by an array portion, a row address, and a column address into a row buffer for an array of non-volatile memory tiles. A row buffer, in certain embodiments, is disposed toward an edge of a same integrated circuit die as an array of non-volatile memory tiles. In certain embodiments, an apparatus includes means for servicing multiple subsequent commands for an operation using data from a row buffer and each of the multiple subsequent commands includes additional addresses used to identify subsets of the data from the row buffer.

Methods are presented for memory array addressing. In one embodiment, a method includes extracting a row address and a column address from a row address of an activate command for a read operation on a memory die. A method, in a further embodiment, includes sensing data from memory cells identified by an extracted row address and column address in a memory die. In certain embodiments, a method includes loading sensed data into a row buffer of a memory die. A method, in one embodiment, includes iteratively transmitting portions of data from a row buffer in response to read commands for a read operation. Column addresses of read commands, in some embodiments, identify portions of data from a row buffer.

Computer program products comprising a non-transitory computer readable storage medium are presented. In certain embodiments, a computer readable storage medium stores computer usable program code executable to perform one or more of the operations described with regard to the disclosed methods, apparatuses, and systems.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
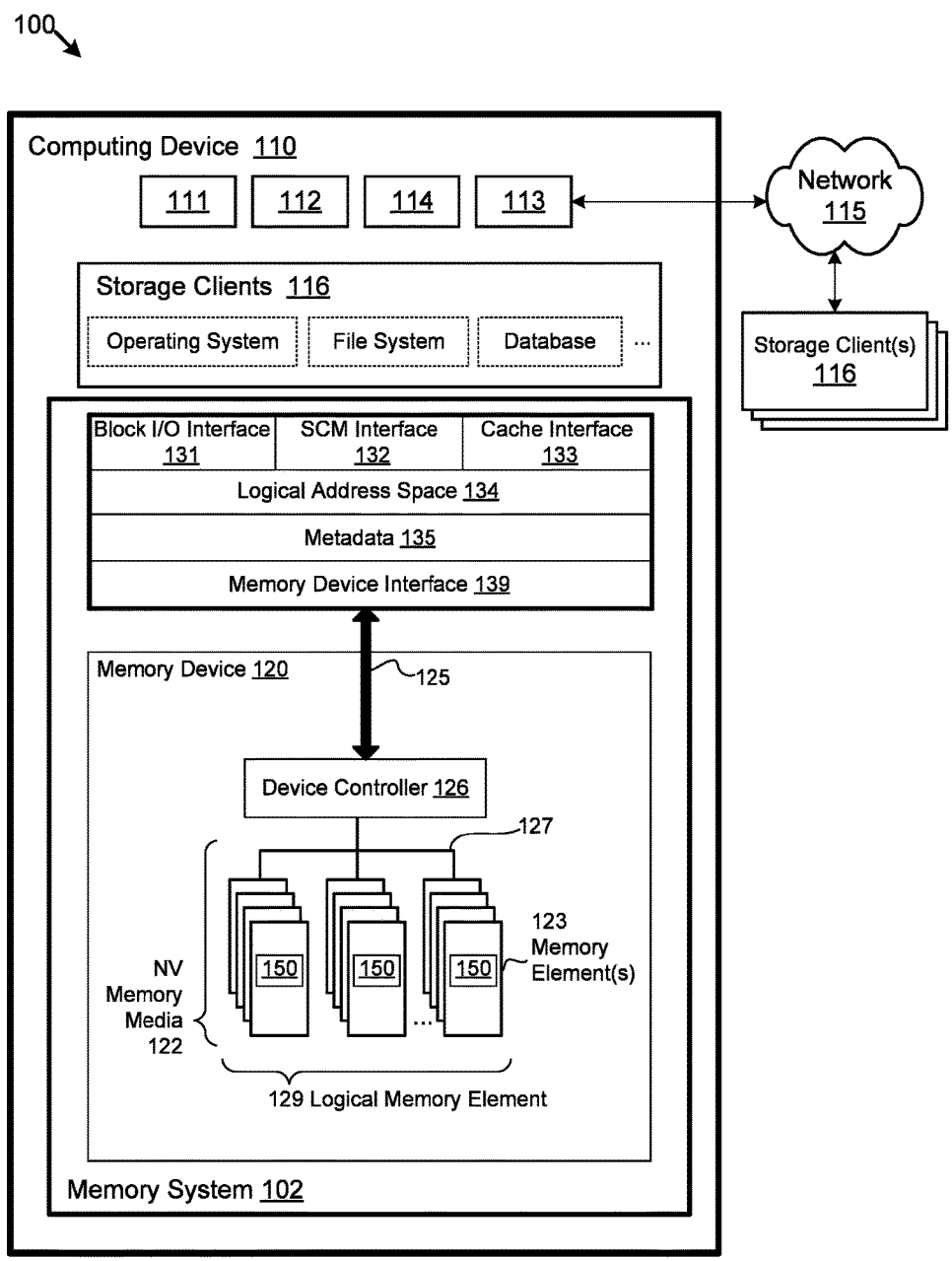
FIG. 1 is a schematic block diagram illustrating one embodiment of a system for cross-point memory array addressing.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 for a cross-point memory array. The system 100 comprises one or more addressing circuits 150 for a non-volatile and/or volatile memory device 120. In certain embodiments, instead of or in addition to accessing data using a row address received with an activate command for a data operation (e.g., a row address select and/or RAS) and a column address received with a subsequent command (e.g., a column address select and/or CAS), the addressing circuit 150 is configured to receive both a row address and a column address multiplexed into the same address and received with an activate command for a data operation (e.g., a row address and a column address may be combined as a first row address and a second row address within the same RAS signal/command). In a further embodiment, the same address the addressing circuit 150 receives also includes an array portion, identifying multiple memory regions (e.g., memory blocks, tiles, cores, banks, bank groups, die, die planes, or the like) for the data operation.

An activate command, as used herein, comprises a command, signal, and/or request that triggers, signals, and/or requests a preparatory action for one or more subsequent commands, signals, and/or requests. For example, an activate command may comprise a predefined signal (e.g., a command signal ACT being low; command signals CS and RAS being low while command signals CAS and WE are high; or the like), a predefined command (e.g., an open row command), or the like. For volatile memory, such as dynamic random access memory (DRAM), synchronous DRAM (SDRAM), or the like, in certain embodiments, an activate command may pre-charge and/or open a row for a read and/or write command. In certain embodiments, the addressing circuit 150 may receive an activate command for a non-volatile memory array, such as storage class memory (SCM) described below, and instead of only pre-charging or opening a row, the addressing circuit 150 may load, copy, and/or pre-fetch data for a plurality of subsequent operations (e.g., read operations, write/program operations) into a read buffer. For example, the addressing circuit 150 may load data from multiple memory regions into a shared row buffer in response to an activate command, in preparation for one or more subsequent read and/or write/program commands. In one embodiment, the addressing circuit 150 may support two or more different types of activate commands, such as a fast page mode activate command, in response to which the addressing circuit 150 pre-fetches and/or otherwise loads more data than was requested to fill the row buffer; a legacy mode activate command, in response to which the addressing circuit 150 opens and/or activates an identified row but does not pre-fetch extra data into the row buffer; and/or other types of activate commands.

An activate command may comprise one or more addresses, such as a row address, a bank address, a bank group address, and/or another address, to indicate to the addressing circuit 150 which memory locations to prepare for a subsequent command, signal, and/or request. The addressing circuit 150 may load data for a data operation (e.g., sensing data from the memory array for a read operation, loading and/or latching write data for a program or write operation, or the like) into a row buffer using the address received with the activate command (e.g., using a row address and a column address multiplexed into the received address as two row addresses and/or as two portions of the same row address), before receiving a second address (e.g., a column address of a CAS signal/command). The addressing circuit 150 may use the second address as an index or offset for retrieving data already stored in the row buffer.

In certain embodiments, the addressing circuit 150 may receive a larger address (e.g., more address bits) with a first command (e.g., an activate command) and receive one or more smaller addresses (e.g., less address bits) with subsequent commands (e.g., read and/or write/program commands). For example, in one embodiment, an activate command may comprise an address with an array address portion (e.g., a tile address and/or bank address), a first row address portion, and a second row address portion (e.g., a column address) each multiplexed together into the same address (e.g., 4 bits for the array address portion, 11 bits for the first row address portion, 11 bits for the second address portion, or the like) and a subsequent read and/or write/program command may comprise a single column address (e.g., a 7 bit column address used as an index or offset to identify data already in the row buffer). By front-loading address bits in a first command (e.g., an activate command) with fewer address bits in subsequent commands, in certain embodiments, the addressing circuit 150 may pre-fetch and/or load enough data into the row buffer for multiple subsequent commands, reducing latency for the multiple subsequent commands because the data is already in the row buffer when the subsequent commands are received by the addressing circuit 150.

The data stored in the row buffer may be from multiple memory regions (e.g., memory blocks, tiles, cores, banks, bank groups, die, die planes, or the like) identified by an array portion of the address received with the activate command (e.g., one bit per memory region, one byte per memory region, or another predefined number of bits per memory region). For example, the row buffer may be shared by multiple memory regions instead of being located with a single memory region, and may be located at an edge of an integrated circuit die and/or chip, close to input/output pads, DDR circuitry, a data path, or the like.

In this manner, in certain embodiments, by multiplexing a row address and a column address into a single row address received with an activate command (e.g., breaking up a row address into a row address and a column address), the addressing circuit 150 may reduce a latency for one or more associated data operations, because the data will already be stored in the row buffer before the subsequent addresses (e.g., column addresses of a CAS signal/command) are received with subsequent commands for the one or more associated data operations (e.g., read commands, program and/or write commands, or the like). In one embodiment, data may be quickly read from the row buffer in response to receiving a subsequent address (e.g., a column address of a CAS signal/command), without an additional sensing operation for memory regions of the memory array (e.g., reducing a tRL time or read latency).

In a further embodiment, where the row buffer stores data from multiple different memory regions (e.g., one bit from each of a plurality of selected memory regions, or the like), the data from the multiple different memory regions may be read in parallel and/or at the same time, minimizing an tRCD time (e.g., a time between receiving an activate command with a row address such as the multiplexed address described above and receiving a subsequent command with a column address), reading data for multiple subsequent commands at the same time (e.g., reading a page of data in response to a request for a single byte, eight bytes, or the like). In certain embodiments, the addressing circuit 150 may allow non-volatile storage class memory (SCM) to be used in place of volatile memory such as dynamic random access memory (DRAM) or the like (e.g., by providing latencies about as low as volatile memory, as low as volatile memory, lower than volatile memory, or the like; by providing bulk read capabilities to read pages and/or blocks at a time; or the like).

An addressing circuit 150 may be part of a non-volatile and/or volatile memory element 123, and may be in communication with a non-volatile and/or volatile memory media controller 126, a device driver, or the like. In some embodiments, an addressing circuit 150 may at least partially operate on and/or in communication with a non-volatile and/or volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or memory controller 126 to a communication network 115, such as an Internet Protocol (IP) network, a Storage Area Network (SAN), wireless network, wired network, or the like.

The memory device 120, in various embodiments, may be disposed in one or more different locations relative to the computing device 110. In one embodiment, the memory device 120 comprises one or more non-volatile and/or volatile memory elements 123, such as semiconductor chips or packages or other integrated circuit devices disposed on one or more printed circuit boards, storage housings, and/or other mechanical and/or electrical support structures. For example, the memory device 120 may comprise one or more direct inline memory module (DIMM) cards, one or more expansion cards and/or daughter cards, a memory card, a universal serial bus (USB) drive, a solid-state-drive (SSD) or other hard drive device, and/or may have another memory and/or storage form factor. The memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the addressing circuit 150 may receive and/or execute one or more computer readable instructions stored on the non-transitory storage medium 114.

In one embodiment, an addressing circuit 150 may comprise logic hardware of a non-volatile and/or volatile memory element 123, other programmable logic, firmware for a non-volatile and/or volatile memory element 123, microcode for execution by a non-volatile and/or volatile memory element 123, or the like. In another embodiment, an addressing circuit 150 may comprise, receive, execute, and/or store executable software code, stored on a computer readable storage medium for execution by logic hardware of a non-volatile and/or volatile memory element 123. In a further embodiment, an addressing circuit 150 may include a combination of logic hardware and executable code.

In one embodiment, the one or more addressing circuits 150 are configured to receive requests and/or commands from a host computing device 110, a storage client 116, a device driver, an executable application, or the like via one or more buses 125, 127, a memory media controller 126, or the like. The addressing circuit 150 may be further configured to transfer data to/from a host computing device 110, a storage client 116, a device driver, an executable application, or the like via the bus 125. Accordingly, the addressing circuit 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the addressing circuit 150 may receive storage requests as an API call from a storage client 116, as an IO-CTL command, or the like.

According to various embodiments, a memory controller 126 may manage one or more memory devices 120 and/or memory elements 123. The memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 120). Memory units and/or regions may include, but are not limited to: pages, memory divisions, blocks, sectors, collections or sets of physical storage locations (e.g., logical pages, logical blocks), tiles, cores, banks, bank groups, die, die planes, chips, or the like.

A device driver and/or the memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the memory device 120 may maintain metadata 135, such as a logical to physical address mapping structure, to map logical addresses of the logical address space 134 to media storage locations on the memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more memory devices 120. The one or more memory devices 120 may include different types of memory devices including, but not limited to: solid-state storage devices, semiconductor storage devices, SAN storage resources, volatile memory devices, non-volatile memory devices, or the like. The one or more memory devices 120 may comprise one or more respective memory media controllers 126 and memory media 122. A device driver may provide access to the one or more memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the memory device 120. Also, in some embodiments, the SCM interface 132 presented to the storage clients 116 provides access to data transformations implemented by the one or more memory devices 120 and/or the one or more memory media controllers 126.

A device driver may present a logical address space 134 to the storage clients 116 through one or more interfaces. As discussed above, the logical address space 134 may comprise a plurality of logical addresses, each corresponding to respective media locations the on one or more memory devices 120. A device driver may maintain metadata 135 comprising any-to-any mappings between logical addresses and media locations, or the like.

A device driver may further comprise and/or be in communication with a memory device interface 139 configured to transfer data, commands, and/or queries to the one or more memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The memory device interface 139 may communicate with the one or more memory devices 120 using input-output control (IO-CTL) command(s), IO-CTL command extension(s), remote direct memory access, or the like.

The communication interface 113 may comprise one or more network interfaces configured to communicatively couple the computing device 110 and/or the memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The memory controller 126 is part of and/or in communication with one or more memory devices 120. Although FIG. 1 depicts a single memory device 120, the disclosure is not limited in this regard and could be adapted to incorporate any number of memory devices 120, a combination of one or more volatile memory devices 120 and one or more non-volatile memory devices 120, or the like.

The memory device 120 may comprise one or more elements 123 of memory media 122. In one embodiment, an element 123 of memory media 122 comprises a volatile memory medium 122, such as random access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. In certain embodiments, an element 123 of memory media 122 comprises a non-volatile memory medium 122, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; may have a read latency as low as or lower than DRAM; may have bulk read capabilities to read data one or more pages and/or blocks at a time; and/or offer one or more other benefits or improvements when compared to other technologies. For example, storage class memory may comprise one or more non-volatile memory elements 123 of ReRAM, Memristor memory, programmable metallization cell memory, phase change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like.

Further, the non-volatile memory device 120, in various embodiments, may comprise a non-volatile recording device, a non-volatile memory device, a non-volatile storage device, or the like. Similarly, a non-volatile memory element 123, in various embodiments, may comprise a non-volatile recording element, a non-volatile memory element, a non-volatile storage element, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102. A device driver may further comprise a non-volatile memory device interface 139 that is configured to transfer data, commands, and/or queries to the non-volatile memory media controller 126 over a bus 125, as described above.

Figure 2:
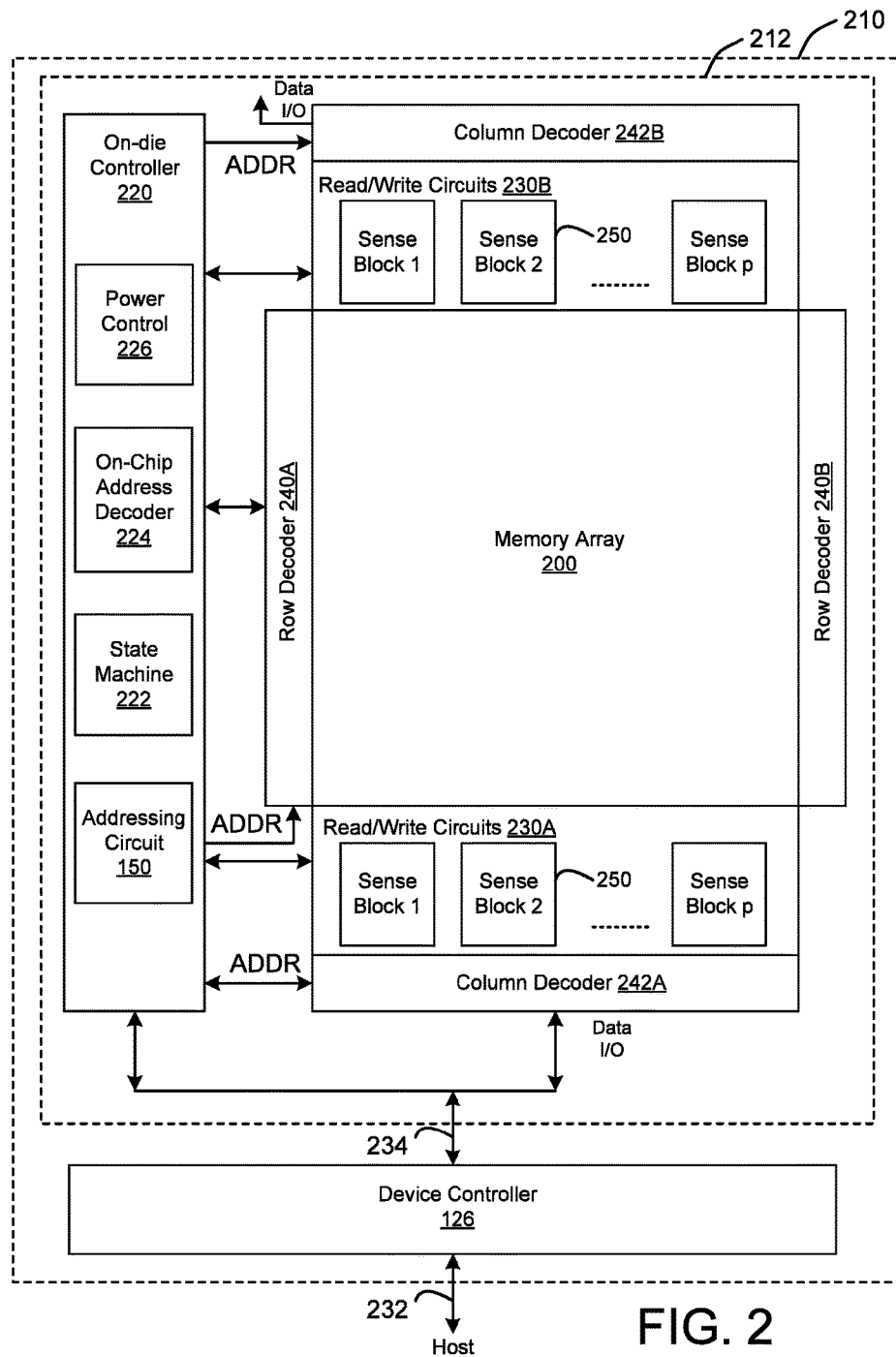
FIG. 2 is a schematic block diagram illustrating another embodiment of a system for cross-point memory array addressing.

FIG. 2 illustrates an embodiment of a non-volatile storage device 210 that may include one or more memory die or chips 212. The nonvolatile storage device 210 may be substantially similar to the nonvolatile memory device 120 described with reference to FIG. 1. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes an addressing circuit 150, a state machine 222, an on-chip address decoder 224, and a power control circuit 226.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage.

In certain embodiments, the state machine 222 and/or the sense blocks 250 includes an embodiment of the addressing circuit 150. The addressing circuit 150, in certain embodiments, may include hardware, firmware, and/or executable code of the sense blocks 250, a die controller 220 and/or a state machine 222.

In one embodiment, one or any combination of die controller 220, addressing circuit 150, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 3:
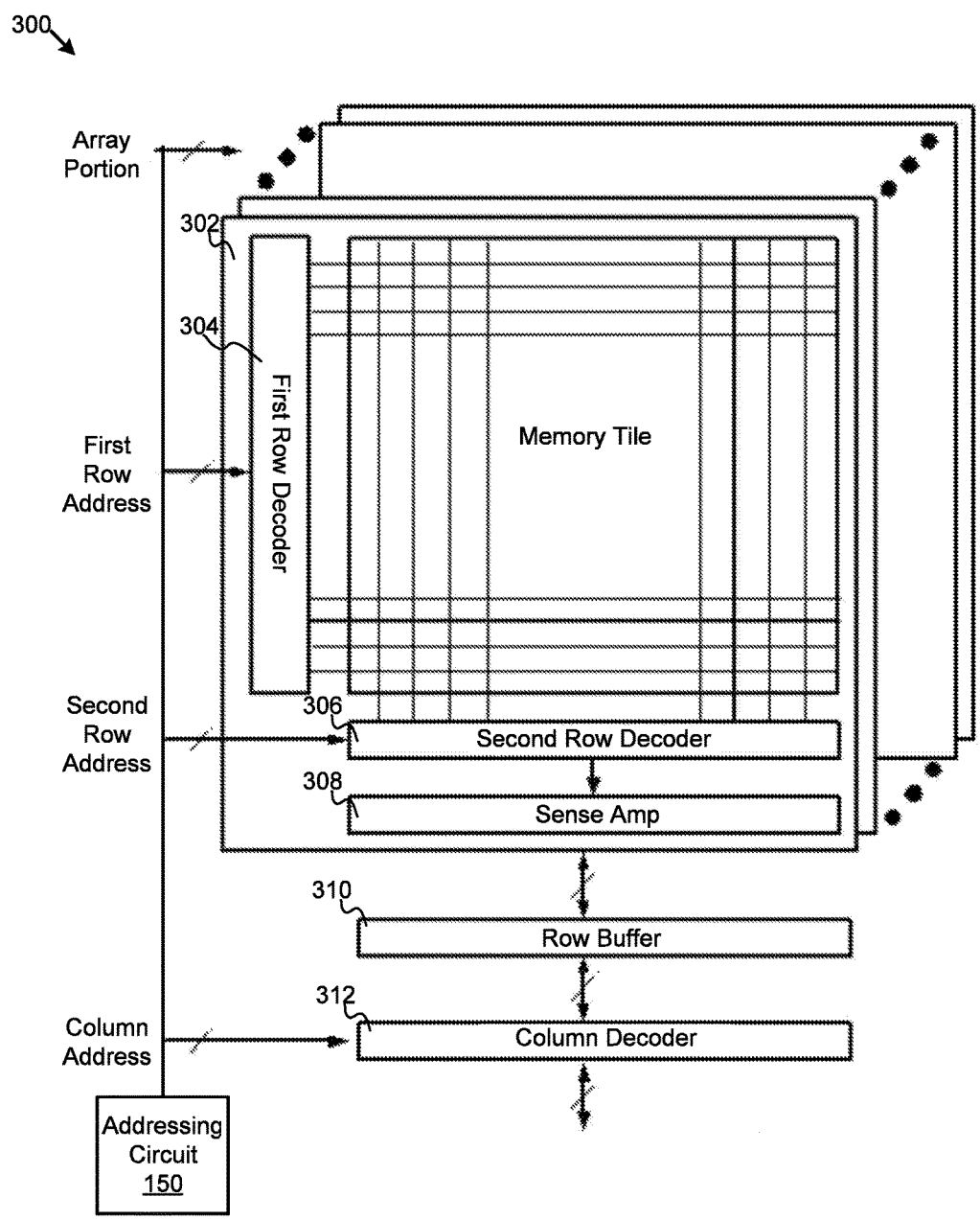
FIG. 3 is a schematic block diagram illustrating a further embodiment of a system for cross-point memory array addressing.

FIG. 3 depicts one embodiment of a cross-point memory array 300. In the depicted embodiment, memory cells of the array 300 are disposed at cross-points of rows and columns, word lines and bit lines, or the like to for a two dimensional and/or three-dimensional memory array 300. The memory array 300, in certain embodiments, includes multiple memory regions 302 (e.g., memory tiles, cores, blocks, banks, bank groups, sectors, die, die planes, or the like), an addressing circuit 150, a row buffer 310, and a column decoder 312. Each memory region 302, in the depicted embodiment, includes a first row decoder 304, a second row decoder 306, and sense amplifiers 308.

The addressing circuit 150, in certain embodiments, is configured to receive an address for an operation on the array 300 of multiple memory regions 302. The address may comprise a first row address for the first row decoder 304 and a second row address (e.g., a column address) for the second row decoder 306, both multiplexed into the same address and received with an activate command for a data operation. In the depicted embodiment, the first row decoder 304 and the second row decoder 306 are both referred to as "row decoders" because they both receive and decode address bits from a row address (e.g., with a row address and a column address multiplexed within it) received with an activate command. However, in other embodiments, the second row decoder 306 may be referred to as a column decoder 306, even though the column address it receives is multiplexed into a row address and received with an activate command, to distinguish it from the first row decoder 304 which is on a perpendicular side of the memory regions 302 from the second row decoder 306.

The row buffer 310, in the depicted embodiment, is disposed outside of the memory regions 302, but on the same integrated circuit die 123 and/or chip 123 as the memory regions 302. The row buffer 310 may be configured to store data identified by multiplexed row and column addresses and/or first and second row addresses from the addressing circuit 150 from the multiple memory regions 302 (e.g., receiving the data from the sense amplifiers 308 for a read operation, receiving the data from I/O lines for a write operation, or the like). For example, the row buffer 310 may store one bit of data from each memory region 302 identified by an array portion (e.g., a tile address) from the addressing circuit 150 (e.g., received as part of the same address as the multiplexed row and column addresses and/or first and second row addresses with an activate command), meaning the multiplexed row and column addresses and/or first and second row addresses identify one bit (e.g., one selected cross-point) in each memory region 302 identified by the array portion (e.g., tile address). The addressing circuit 150, in certain embodiments, selects data of a data operation from the row buffer 310 based on a second address (e.g., a column address) received with a subsequent command for the data operation, by sending the second address to the column decoder 312 or the like.

The row buffer 310 may strobe or latch out data in response to a plurality of additional column addresses received with a plurality of additional subsequent commands for an operation (e.g., read commands for the same logical row of data, each with different column addresses referencing data at a different offset within the row buffer 310 or the like). In certain embodiments, the row buffer 310 may strobe or latch data in (e.g., storing and/or buffering the data) for writing or programming to the multiple memory regions 302, in response to a plurality of additional column addresses received with a plurality of additional subsequent write and/or program commands.

Figure 4:
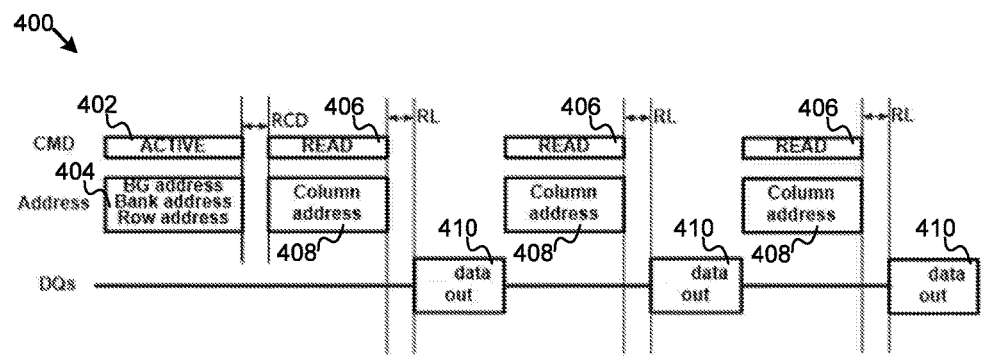
FIG. 4 is a schematic block diagram illustrating one embodiment of timing for an operation on a cross-point memory array

FIG. 4 depicts one embodiment of timing 400 for an operation on a cross-point memory array 300. In the depicted embodiment, the addressing circuit 150 receives a first address 404 with an activate command 402. The first address 404 includes an array portion (e.g., an array address, a bank group (BG) address, a bank address, and/or a tile address) and a row address. In certain embodiments, the row address includes a multiplexed row and column address, multiplexed first and second row addresses, or the like. Two addresses may be multiplexed into a single address by appending one address to a second address sequentially, by hashing the two addresses, and/or by otherwise reversibly combining the two addresses.

In response to the activate command 402, the addressing circuit 150 selects multiple memory regions 302 identified by the array portion of the first address 404, provides the multiplexed row address from the first address 404 to the first row decoder 302, and provides the multiplexed column address (e.g., second row address) to the second row decoder 306 and reads data identified by the first address 404 into the row buffer 310 using the sense amplifiers 308. In this manner, in certain embodiments, the latency and/or delay of reading and/or sensing the data occurs once during the tRCD time period, and adds no latency to the subsequent tRL time periods for the subsequently received read commands 406.

The addressing circuit 150, in the depicted embodiment, receives a plurality of subsequent read commands 406, each with a subsequent address 408 (e.g., a column address). The addressing circuit 150 provides the subsequent addresses 408 (e.g., column addresses) to the column decoder 312 to select data 410 at requested offsets from within the row buffer 310 and to strobe and/or latch the data out (e.g., on one or more DQ lines or other data bus). In this manner, in certain embodiments, a storage class memory array 300 may be compatible with and/or have one or more benefits of, a volatile memory access protocol (e.g., a Jedec® DDR3, DDR4, and/or DDR5 specification, or the like), with reduced latency when compared to other non-volatile memory access techniques.

Figure 5:
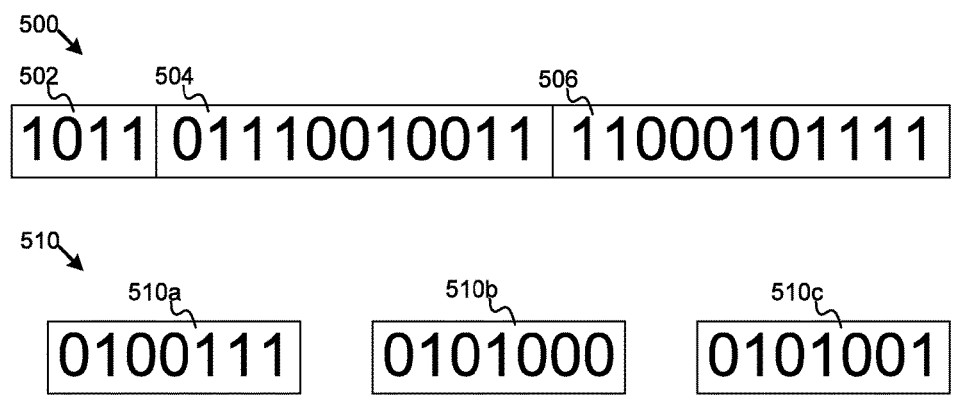
FIG. 5 is a schematic block diagram illustrating one embodiment of addresses for a cross-point memory array.

FIG. 5 depicts one embodiment of addresses 500, 510 for a cross-point memory array 300. An addressing circuit 150, in certain embodiments, receives a first address 500 as part of an activate command for an operation on a memory array 300. The first address 500, in the depicted embodiment, includes an array portion 502 (e.g., 4 bits to identify and/or select 1024 tiles at a time from 16 k tiles, or the like), a row address 504 (e.g., 11 bits for a 4 Mb tile), and a column address 506 and/or second row address 506 (e.g., 11 bits for a 4 Mb tile). An addressing circuit 150, in some embodiments, receives a plurality of subsequent second addresses 510 (e.g., column addresses 510a, 510b, 510c) each with a subsequent command, such as a read command or the like. In the depicted embodiment, the subsequent second addresses 510 and/or column addresses 510 comprise 7 bit addresses (e.g., to identify 8 bytes or 64 bits from a 1 Kb row buffer 310, or the like).

In one embodiment, the addressing circuit 150 provides address multiplexing at the time of an activate command, breaking the row address 500 up into two or more pieces 502, 504, 506 and feeding them to the memory core, tile, or the like separately. The addressing circuit 150, in certain embodiments, reads whole pages in response to a single byte being requested (e.g., in a pre-fetch scheme). The addressing circuit 150, in one embodiment, moves an entire page to the row buffer 310 located near the DDR circuitry input/output pad (e.g., toward an edge of the memory element 123 such as an integrated circuit die, die plane, chip, or the like; between the memory cells of the array and input/output contacts of the integrated circuit die, die plane, chip, or the like). As a result, in certain embodiments, the timing from the register (e.g., row buffer 310) to output (e.g., input/output pad or contact) is a simple logic delay, without an additional memory sense operation or the like. The next bytes, in one embodiment, may be sent in response to receiving a column address 510 (e.g., in a subsequent read command for the same read operation).

The memory array 122, in certain embodiments, comprises byte-addressable "cross-point" storage class memory (e.g., with memory cells at intersections of an array of word lines and bit lines or the like). In one embodiment, the "column addresses" 510 are used to access data using a column decoder 312 located next to the "row buffer" 310 outside of a memory tile 302 and/or core 302, instead of the column addresses referring to actual columns in the memory tile 302 and/or core 302.

Figure 6:
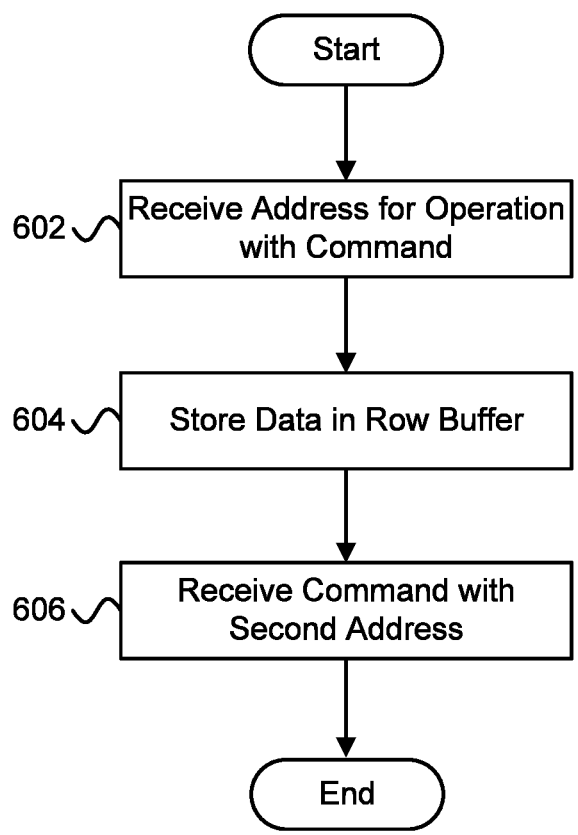
FIG. 6 is a schematic flow chart diagram illustrating one embodiment of a method for cross-point memory array addressing.

FIG. 6 depicts one embodiment of a method 600 for memory array addressing. The method 600 begins and an addressing circuit 150 receives 602 an address for an operation on an array 122, 200. In one embodiment, the addressing circuit 150 receives 602 the address as a row address with an activate command for the operation. The received 602 address may comprise one or more of an array portion 502, a row address 504, a column address 506, or the like multiplexed and/or encoded into the same, single address.

The addressing circuit 150 stores 604 data identified by the received 602 address (e.g., by an array portion 502, a row address 504, and/or a column address 506 multiplexed and/or encoded into the received 602 address) in a row buffer 310. The addressing circuit 150 receives 606 one or more subsequent commands (e.g., read commands, write commands, or the like) comprising one or more second and/or subsequent addresses (e.g., column addresses 510) which the addressing circuit 150 may use to identify data in the row buffer 310 (e.g., an offset in the row buffer 310, a location in the row buffer 310 at which to store read data from memory cells of the array 122, 200, a location in the row buffer 310 at which to store write data for programming to memory cells of the array 122, 200, or the like). The addressing circuit 150 may use the stored 604 data from the row buffer 310 and/or the received 602, 606 addresses to service the one or more received 606 subsequent commands. The method 600 ends.

Figure 7:
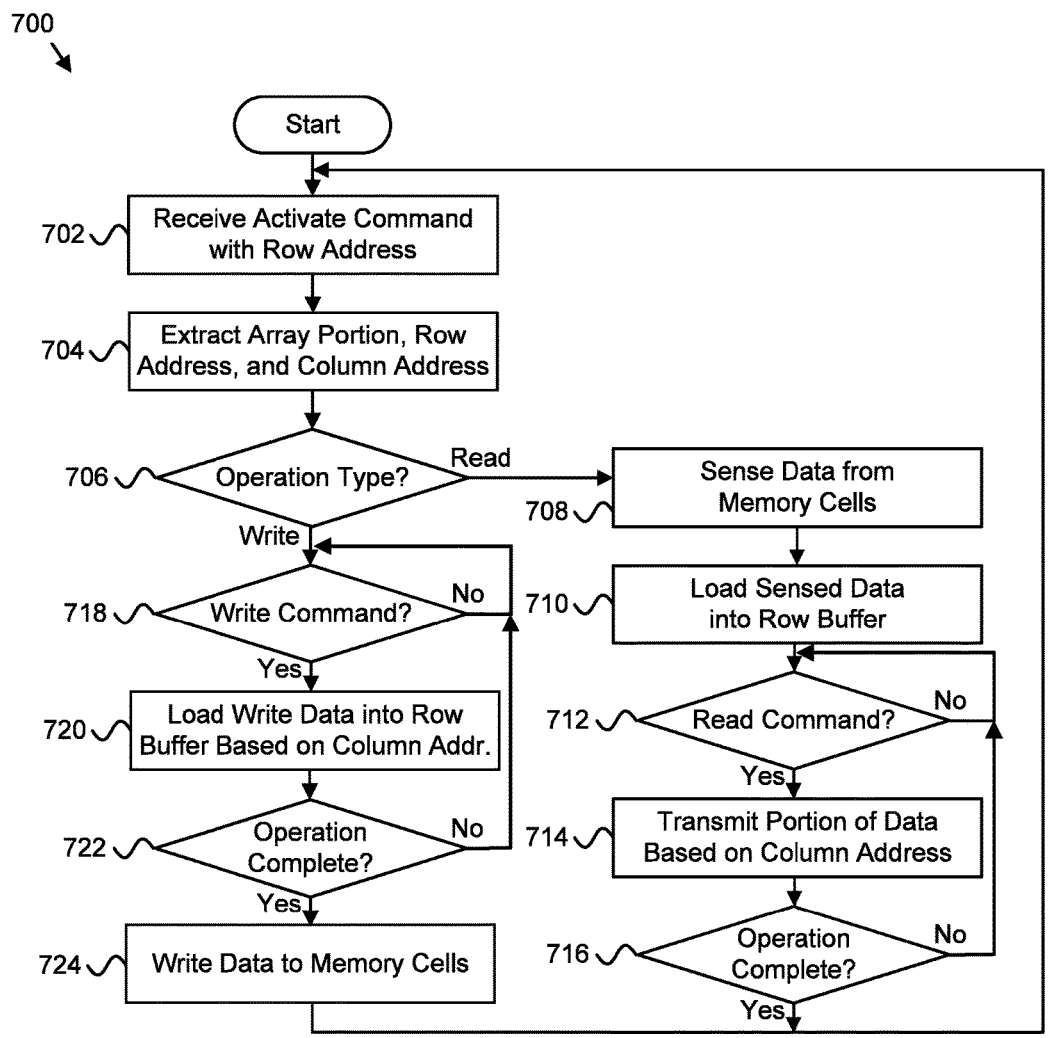
FIG. 7 is a schematic flow chart diagram illustrating a further embodiment of a method for cross-point memory array addressing.

FIG. 7 depicts one embodiment of a method 700 for memory array addressing. The method 700 begins and an addressing circuit 150 receives 702 an activate command with a row address 500 for a data operation (e.g., for a read operation, a write operation, another data operation, or the like). The addressing circuit 150 extracts 704 and/or decodes 704 one or more of an array portion 502, a row address 504, and a column address 506 (e.g., a second row address 506 used as a column address 506 or the like) from the row address 500 of the received 702 activate command.

If the addressing circuit 150 determines 706 that the data operation is a read operation, the addressing circuit 150 (e.g., using the sense amplifiers 250, the read/write circuits 230, or the like) senses 708 and/or reads 708 data from the memory cells identified by or associated with the extracted 704 array portion 502, row address 504, and/or column address 506 (e.g., a bit per memory tile identified by the array portion 502, or the like). The addressing circuit 150 loads 710, latches 710, and/or stores 710 the sensed 708 data into the row buffer 310. In response to receiving 712 a read command for the data operation, the addressing circuit 150 transmits 714, latches 714, transfers 714, and/or sends 714 a portion of the data from the row buffer 310 based on a column address 510 or the received 712 read command. The addressing circuit 150 may continue to receive 712 and service additional read commands, until the addressing circuit 150 determines 716 that the read operation is complete (e.g., in response to a deactivate or close command, in response to transmitting 714 all of the read data from the row buffer 310, or the like) and the method 700 may continue to perform one or more subsequent data operations.

If the addressing circuit 150 determines 706 that the data operation is a write operation, the addressing circuit 150 receives 718 one or more write commands and loads 720 write data into the row buffer 310 at locations selected based on column addresses 510 of each of the received 718 one or more write commands. In response to determining 722 that the write operation is complete (e.g., in response to a deactivate or close command, in response to the row buffer 310 being full, or the like) the addressing circuit 150 writes 724 and/or programs 724 the write data from the row buffer 310 to memory cells identified by or associated with the extracted 704 array portion 502, row address 504, and/or column address 506 (e.g., a bit per memory tile identified by the array portion 502, or the like) and the method 700 may continue to perform one or more subsequent data operations.

Means for decoding and/or extracting an address 500 received for an operation on an array 122 of non-volatile memory tiles 302 of an integrated circuit die 123 into an array portion 502, a row address 504, and/or a column address 506, in various embodiments, may include an addressing circuit 150, an on-die controller 220, an on-chip address decoder 224, a state machine 222, a device controller 126, an integrated circuit device 123 (e.g., a memory die, a memory chip, or the like), a first row decoder 304, a second row decoder 306 and/or column decoder 306, a processor 111, an FPGA, an ASIC, other logic hardware, and/or other executable code stored on a computer readable storage medium. Other embodiments may include similar or equivalent means for decoding and/or extracting an address 500 received for an operation on an array of non-volatile memory tiles 302 of an integrated circuit die 123.

Means for loading data identified by an array portion 502, a row address 504, and/or a column address 506 (and/or a second row address 506) into a row buffer 310 for an array 122 of non-volatile memory tiles 302, in various embodiments, may include an addressing circuit 150, an on-die controller 220, an on-chip address decoder 224, a state machine 222, a device controller 126, an integrated circuit device 123 (e.g., a memory die, a memory chip, or the like), a sense amplifier 308, a column decoder 312, a processor 111, an FPGA, an ASIC, other logic hardware, and/or other executable code stored on a computer readable storage medium. Other embodiments may include similar or equivalent means for loading data identified by an array portion 502, a row address 504, and/or a column address 506 (and/or a second row address 506) into a row buffer 310 for an array 122 of non-volatile memory tiles 302.

Means for servicing multiple subsequent commands for an operation using data from a row buffer 310, in various embodiments, may include an addressing circuit 150, a column decoder 312, an on-die controller 220, an on-chip address decoder 224, a state machine 222, a device controller 126, an integrated circuit device 123 (e.g., a memory die, a memory chip, or the like), input/output pads and/or contacts, a processor 111, an FPGA, an ASIC, other logic hardware, and/or other executable code stored on a computer readable storage medium. Other embodiments may include similar or equivalent means for servicing multiple subsequent commands for an operation using data from a row buffer 310.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.]

What is claimed is:

1. An apparatus comprising:
   an array of multiple memory regions;
   an addressing circuit configured to receive an address for an operation on the array of multiple memory regions, the address comprising a row address and a column address both multiplexed into the same received address, received with a single activate command for the operation, and identifying one bit from row and column locations identified by the multiplexed row and column addresses in each of at least a subset of the multiple memory regions; and a row buffer for the array of multiple memory regions, the row buffer configured to store the one bit from each of the row and column locations identified by the multiplexed row and column addresses from each of the at least a subset of the multiple memory regions, data of the operation iteratively selected from different locations within the row buffer based on a plurality of subsequent addresses received with subsequent commands for the operation.

2. The apparatus of claim 1, wherein the address further comprises an array portion identifying the at least a subset of the multiple memory regions of the array for the operation.

3. The apparatus of claim 1, wherein the row address and the column address are multiplexed into the address as a row address received with the activate command.

4. The apparatus of claim 1, wherein the plurality of subsequent addresses are received as column addresses with the subsequent commands for the operation.

5. The apparatus of claim 4, wherein the subsequent commands comprise read commands for the operation.

6. The apparatus of claim 4, wherein each of the column addresses reference data at a different offset in the row buffer.

7. The apparatus of claim 1, wherein the row buffer is disposed on the same integrated circuit chip as the array of multiple memory regions and buffers data for operations on each of the multiple memory regions.

8. The apparatus of claim 7, wherein each of the multiple memory regions comprises a cross-point memory tile of the same integrated circuit die and the row buffer is disposed outside of the cross-point memory tiles toward an edge of the same integrated circuit die.

9. The apparatus of claim 7, wherein each of the multiple memory regions comprises an integrated circuit die of the same integrated circuit chip and the row buffer is disposed outside of the integrated circuit dies toward an edge of the same integrated circuit chip.

10. The apparatus of claim 1, wherein the array of multiple memory regions comprises non-volatile storage class memory comprising one or more of phase change memory, magneto-resistive random access memory, and resistive random access memory.

11. An apparatus comprising:
means for decoding an address received for an operation on an array of non-volatile memory tiles of an integrated circuit die into an array portion, a row address, and a column address from the same received address received with a single activate command for the operation;
means for loading one bit per tile from row and column locations identified by the array portion, the row address, and the column address into a row buffer for the array of non-volatile memory tiles, the row buffer disposed toward an edge of the same integrated circuit die to store data from multiple non-volatile memory tiles of the array; and
means for servicing multiple subsequent commands for the operation using the data from the row buffer, each of the multiple subsequent commands comprising additional addresses used to identify subsets of the data from different locations within the row buffer.

12. The apparatus of claim 11, wherein the address from which the array portion, the row address, and the column address are decoded is sent as a row address of the activate command and the additional addresses are sent as column addresses of the subsequent commands, the subsequent commands comprising one of read commands and write commands.

13. The apparatus of claim 11, wherein the multiple subsequent commands comprise read commands of the operation and servicing the read commands comprises reading the identified subsets of the data from the row and column locations in the array of non-volatile memory tiles identified by the array portion, the row address, the column address, and the additional addresses.

14. The apparatus of claim 13, wherein the one bit per tile is loaded from a subset of the tiles identified by the array portion from the array of non-volatile memory tiles, at the same row and column location on each identified tile.

15. The apparatus of claim 11, wherein the multiple subsequent commands comprise write commands of the operation and servicing the write commands comprises programming the identified subsets of the data to the row and column locations in the array of non-volatile memory tiles identified by the array portion, the row address, the column address, and the additional addresses, the row and column locations comprising the one bit per tile identified by the array portion from the array of non-volatile memory tiles.

16. A method comprising:
extracting a row address and a column address from a same received row address of a single activate command for a read operation on a memory die;
sensing one bit each from memory cells in row and column locations identified by the extracted row address and column address in different tiles of the memory die and loading the sensed data into a row buffer of the memory die; and
iteratively transmitting different portions of the data from the row buffer in response to read commands for the read operation, column addresses of the read commands identifying the different transmitted portions of the data from the row buffer.

17. The method of claim 16, further comprising:
extracting a program row address and a program column address from a subsequent row address of a subsequent activate command for a program operation on the memory die;
iteratively latching data of the program operation into the row buffer in response to write commands for the program operation, column addresses of the write commands identifying locations for the data in the row buffer; and
programming the data from the row buffer to memory cells identified by the extracted program row address and program column address in the memory die.

18. The method of claim 16, wherein the row buffer is disposed toward a perimeter of the memory die between the memory cells and input/output contacts of the memory die.

* * * * *